(12) United States Patent
Lee et al.

(10) Patent No.: US 6,188,044 B1
(45) Date of Patent: Feb. 13, 2001

(54) HIGH-PERFORMANCE ENERGY TRANSFER SYSTEM AND METHOD FOR THERMAL PROCESSING APPLICATIONS

(75) Inventors: Yong Jin Lee, Palo Alto; Mehrdad M. Moslehi, Los Altos; Jalil Kamali, Freemont; Sergey Belikov, Palo Alto, all of CA (US)

(73) Assignee: CVC Products, Inc., Rochester, NY (US)

( * ) Notice: Under 35 U.S.C. 154(b), the term of this patent shall be extended for 0 days.

(21) Appl. No.: 09/067,142

(22) Filed: Apr. 27, 1998

(51) Int. Cl.[7] ..................................................... F27B 5/14
(52) U.S. Cl. .......................... 219/390; 118/50.1; 392/416; 362/290
(58) Field of Search ...................................... 219/390, 405, 219/411; 118/50.1, 725, 724; 392/416, 418; 250/492.22; 362/290, 293

(56) References Cited

U.S. PATENT DOCUMENTS

| | | |
|---|---|---|
| 3,623,712 | 11/1971 | McNeilly et al. |
| 4,496,609 | 1/1985 | McNeilly et al. ...................... 427/55 |
| 4,649,261 | 3/1987 | Sheets ................................... 219/390 |
| 4,698,486 | 10/1987 | Sheets ................................ 250/492.2 |
| 4,698,487 | 10/1987 | Meister ................................. 219/506 |
| 4,891,335 | 1/1990 | McNeilly .............................. 437/247 |
| 4,989,991 | 2/1991 | Pecot et al. ........................... 374/133 |
| 4,996,942 | 3/1991 | deBoer et al. ........................ 118/666 |
| 5,044,943 | 9/1991 | Bowman et al. ..................... 432/121 |
| 5,098,198 | 3/1992 | Nulman et al. ....................... 374/121 |
| 5,372,648 | * 12/1994 | Yamamoto et al. ............. 118/723 E |
| 5,410,162 | 4/1995 | Tigelaar et al. ......................... 257/48 |
| 5,427,620 | 6/1995 | deBoer et al. ........................ 118/725 |
| 5,444,217 | 8/1995 | Moore et al. ......................... 219/405 |
| 5,445,675 | 8/1995 | Kubodera et al. ................... 118/719 |
| 5,536,918 | * 7/1996 | Ohkase et al. ........................ 219/390 |
| 5,580,388 | 12/1996 | Moore .................................. 118/728 |
| 5,584,936 | 12/1996 | Pickering et al. .................... 118/728 |
| 5,683,518 | 11/1997 | Moore et al. ......................... 118/730 |
| 5,861,609 | * 1/1999 | Kaltenbrunner et al. ............ 219/390 |
| 5,926,615 | * 7/1999 | Hwu et al. ............................ 392/418 |

FOREIGN PATENT DOCUMENTS 0 448 346 A1    9/1991    (EP) .............................. C23C/16/44

OTHER PUBLICATIONS

PCT International Search Report, Aug. 18, 1999.

* cited by examiner

Primary Examiner—Teresa Walberg
Assistant Examiner—Shawntina T. Fuqua
(74) Attorney, Agent, or Firm—Baker Botts L.L.P.

(57) ABSTRACT

An apparatus and method supports thermal processing of a microelectronic device such as a semiconductor chip in a substrate by heating the substrate with secondary radiation from an energy transfer device 40, which has a first set of energy transfer regions comprised of an emissive and thermally conductive material, and a second set of thermally insulating regions comprised of a reduced emissivity and reduced thermal conductivity material or free space. A multi-zone radiant energy source 30 provides radiative energy to energy transfer device 40, with a process controller 36, preferably a multi-zone controller, altering the amount of energy provided by each heat zone associated with each emissive region of energy transfer device 40. Sensors detect the thermal energy level of each energy transfer region to allow controller 36 to adjust the secondary radiation emitted by each region in real time, resulting in a predetermined and controlled distribution of thermal energy on substrate 20. Energy transfer device 40 can have plural emissive and thermally conductive concentric rings separated from each other by reduced emissivity and reduced thermal conductivity regions such as free space gaps 42. Alternatively, a solid plate 54 having an emissive coating or emissive surface 52 can have reduced emissivity and reduced conductivity isolation regions such as trenches 56 for defining the multi-zone high-emissivity and high thermal conductivity energy transfer regions.

61 Claims, 3 Drawing Sheets

HIGH-PERFORMANCE ENERGY TRANSFER SYSTEM AND METHOD FOR THERMAL PROCESSING APPLICATIONS

TECHNICAL FIELD OF THE INVENTION

The present invention relates to a method and system for device fabrication on a substrate and, more particularly, to a method and system for transferring energy from a radiative energy source to a substrate for rapid thermal processing applications in support of microelectronic and semiconductor device fabrication.

BACKGROUND OF THE INVENTION

Semiconductor devices can be formed on silicon wafer substrates by the use of certain fabrication processes some of which involve the application of heat (e.g., in the range of 200° C. to 1100° C.) to the substrate in a controlled environment. Several processing methods for fabricating a device onto a substrate have evolved which include the application of thermal energy to the substrate to drive thermally activated fabrication processes. For instance, chemical-vapor deposition (CVD) processes can deposit various materials on a substrate, including metallic, semiconductor and insulating material layers. Thermal deposition processes and thermal anneal processes can support silicide formation. These chemical and thermal processes can form a microelectronic device such as an insulated gate field-effect transistor (IGFET) on a substrate by manipulating, forming or modifying materials such as silicon dioxide, silicon nitride, tungsten, polysilicon and other known materials. Well-known single-wafer rapid thermal processing (RTP) applications include rapid thermal annealing (RTA), rapid thermal oxidation (RTO), rapid thermal chemical-vapor deposition (RTCVD) processes, and rapid thermal nitridation (RTN).

During the formation of a device such as an IGFET on a substrate by thermal processing techniques such as RTP methods, consistent production of a high-quality semiconductor integrated circuit (IC) with high production yield is enabled when the thermal energy is applied in a uniform and repeatable manner. CVC, Inc. ("CVC") has introduced several significant improvements over conventional thermal processing systems and methods for semiconductor IC fabrication. For instance, CVC has developed a multi-zone radiant-energy illuminator for producing heat in silicon substrates during device fabrication as is disclosed in U.S. patent application Ser. No. 08/678,321 filed on Jul. 11, 1996, and entitled "Multi-Zone Illuminator for Rapid Thermal Processing," which is incorporated herein by reference as if fully set forth. This multi-zone illuminator provides improved wafer-to-wafer process and temperature repeatability as well as within-wafer temperature uniformity by monitoring and controlling optical energy produced by plural lamps arranged in multiple heating zones. The multi-zone illuminator also includes a multi-zone temperature measurement system having plural pyrometry sensors for real-time wafer temperature measurement.

Although the multi-zone illuminator provides improved device fabrication uniformity and repeatability, a number of process control difficulties remain with respect to fabrication by rapid thermal processing (RTP). For instance, in one implementation of rapid thermal processing ("RTP") or rapid thermal chemical-vapor deposition ("RTCVD"), a substrate is generally supported by a susceptor during the application of heat. The susceptor can absorb the radiant optical energy and redistribute thermal energy across the substrate thus nullifying or minimizing effectiveness of the control inputs to a multi-zone illuminator. Another limitation relates to the varying emissivity of the substrate during processing due to the dependence of substrate emissivity on temperature and thin films. Although CVC's multi-zone temperature sensing and control technology in conjunction with multi-zone illuminators can compensate for variations in wafer emissivity (due to any source such as temperature and/or material layers), this compensation can introduce some errors and requires complicated control algorithms which can depend upon extensive testing and calibration runs for each type of substrate being processed. Another difficulty relates to the size and makeup of the susceptor used to support a substrate. The heating susceptor can introduce residue contaminants (e.g., metallic contaminants) to the substrate when the susceptor is in physical contact with the substrate. Also, to provide adequate mechanical support of the substrate, the susceptor can be made of a relatively large mass of thermally conductive material. The larger the mass of a conventional heating susceptor, the more difficult it is to estimate and control the heat energy absorbed and emitted by the susceptor. Moreover, high-thermal-mass susceptors significantly slow down the wafer heating and cooling times, resulting in reduced wafer processing throughout.

SUMMARY OF THE INVENTION

Therefore a need has arisen for a method and apparatus that provides improved temperature control and uniformity during thermal processing of a substrate during fabrication of semiconductor devices on the substrate in a thermal processing equipment.

A further need exists for a method and apparatus that provides improved accuracy and repeatability in measuring the temperature distribution of a substrate during thermal processing applications.

A further need exists for a method and apparatus that provides enhanced spatial control of incident optical radiation to improve the accuracy, uniformity, and repeatability with which a multi-zone illuminator heats a substrate in rapid thermal processing (RTP) including rapid thermal chemical-vapor deposition (RTCVD) applications.

In accordance with the present invention, a high-performance radiant energy transfer system and method is provided that substantially eliminates or reduces disadvantages and problems associated with previously developed methods and apparatus for providing energy to a substrate during thermal processing (e.g., in RTP and RTCVD) for the fabrication of a device such as semiconductor chips. A housing forming a reactor process chamber can be used to isolate a substrate for thermal processing (such as RTA, RTO, RTN, or RTCVD). A radiative heat source such as a multi-zone illuminator can direct radiative energy flux at the substrate to provide thermal energy in support of the thermal fabrication process. An energy transfer device can be disposed between the substrate and the heat source to efficiently and accurately and repeatably transfer energy originated from the radiative energy source to the substrate. The energy transfer device can also substantially decouple the substrate heating as well as temperature measurement and control tasks from the substrate emissivity effects. The energy transfer device can comprise first and second regions, the first regions having a first emissivity and thermal conductivity, and the second regions having a second emissivity and thermal conductivity wherein the first regions can provide a higher degree of energy transfer and the second regions can provide a lower degree of energy transfer. The low energy transfer characteristics of the second regions allow the second regions to act as spacers or energy zone buffers that separate the first regions from each other. In one embodiment, the second regions can be empty spaces formed between adjacent first regions. This arrangement enables excellent multi-zone substrate heating and temperature control via improved controllability of the spatial profile of the incident radiant power on the substrate.

More specifically, the reactor chamber can support any conventional thermal processing system or method for device fabrication onto a substrate, including single-wafer RTP and RTCVD. The radiative energy source can include any known equipment for thermal processing, including the multi-zone illuminator available through CVC, Inc. The radiative energy source can provide thermal energy with conventional tungsten halogen lamps arranged in plural spatially resolved heating zones, such as the concentric or spiral lamp distribution arrangements developed by CVC. The radiant energy provided by the multi-zone illuminator, can be controlled by a multi-zone controller and related temperature sensors associated with each zone and can be adjusted in real time on a zone-by-zone basis by the multi-zone controller associated with the illuminator power supplies and the temperature sensors.

The energy transfer device can include plural energy transfer regions or zones having the first emissivity and/or thermal conductivity, the energy transfer regions disposed so that each first region is associated (in terms of radiant energy transfer) with one or more zones in the multi-zone illuminator. The energy transfer regions can have a high emissivity, meaning that each energy transfer region can absorb (from the illuminator) and emit (mostly to the substrate) all or nearly all of the energy directed at it; and/or, the energy transfer regions can have a relatively high thermal conductivity, meaning that each region can diffuse or distribute thermal energy freely within itself. The energy transfer regions can be separated from each other with plural thermally insulating regions having the second reduced emissivity and/or reduced thermal conductivity.

The thermally insulating regions can have a low emissivity, meaning that they absorb and emit very little or a small fraction of the energy directed at them; and/or the insulating regions can have a low thermal conductivity, meaning that each insulating region resists the diffusion of heat within itself and between neighboring high-emissivity regions. Thus, the thermally insulating regions can divide up the energy transfer regions so that substantially all or most of the radiant energy associated with each zone of the multi-zone illuminator is translated to that zone's associated energy transfer region (or regions), and so that the energy transfer regions transfer very little thermal energy between each other in the form of heat conduction due to the low thermal conductivity of the thermally insulating regions. In addition, the thermally insulating regions can have special geometric designs to reduce energy absorption, such as a significantly smaller exposed surface area compared to the energy transfer regions (such as small free-space gaps between the high-emissivity regions).

The energy transfer device can comprise a central disk and plural concentric rings disposed about the central disk, the central disk and the concentric rings forming higher-emissivity energy transfer regions. An insulating region can be inserted at the inner circumference of each concentric ring. In one embodiment, the energy transfer regions of concentric rings are comprised of silicon carbide (or aluminum nitride, or graphite, or boron nitride or silicon) and the insulating regions are comprised of free-space gaps. In another embodiment, the energy transfer device can be formed from a single contiguous plate having insulating regions etched into or embedded in the plate between each alternating energy transfer region (or within the high-emissivity region).

The energy transfer device of the present invention can support thermal processing of various substrates such as silicon through secondary radiation. A radiative energy source having plural radiant energy zones can be directed at the energy transfer device with one or more specific radiant energy zones operable to provide a predetermined and controlled amount of radiative energy (adjustable and controllable in real time). An emissive region can be associated with at least one of each such radiant energy zones to absorb most or substantially all of the radiative energy projected onto the surface of the energy transfer region and to provide secondary radiative energy to the substrate. A temperature sensor can measure the temperature of each emissive region to determine the amount of secondary radiative energy being transferred to the substrate and to extract the projected substrate temperature. A multi-zone controller associated with the radiative energy source can adjust the energy level of each emissive region in real-time by altering the amount of radiative energy provided by the one or more radiant zones associated with each region.

The high performance energy transfer system and method according to the present invention provides important technical advantages. The energy transfer device maps one or more specific zones of a multi-zone controlled radiative energy source to a particular zone on the heated substrate within a processing chamber, thus providing the multi-zone control authority needed for real-time temperature uniformity control and for excellent repeatability of thermal fabrication processes.

Another important technical advantage is that the energy transfer device can be constructed with materials having characteristics which allow accurate and repeatable measurement of each region's energy level or temperature. Thus, the output signals of the real-time sensors can be used by a multi-zone controller to accurately adjust the energy provided to each region by specific sets of associated zones without any significant interference effects or errors caused by wafer emissivity variations.

Another important technical advantage of the present invention is that the energy transfer device can be placed proximate to but not in contact with the substrate, thus avoiding contamination of the substrate by the energy transfer device. The distance between the substrate and the energy transfer device can advantageously be adjusted to accurately control the secondary radiation pattern projected by the energy transfer device to the substrate (and also the degree of separations of energy profiles from different zones). For instance, the distance between the substrate and the energy transfer device can be arranged so as to be less than the width of the radiation rings (e.g., for a radiation ring width of 5 mm, the distance between the substrate and the energy transfer device is chosen to be preferably in the range of ~1 mm to ~5 mm).

Another important technical advantage is that, in a configuration in which the energy transfer device does not directly support the substrate, the energy transfer device can be constructed of a relatively small mass of a material, resulting in small thermal mass and rapid thermal response. The smaller is the mass of the energy transfer device for a given type of material, the quicker is the response of the energy transfer device to increased energy input, or the removal of energy due to reduced input radiant energy, thus providing faster heating and cooling rates than conventional contact susceptors can provide.

Another important technical advantage is achieved by the partitioning and separation of the energy transfer device into separate zones. These separations preferably have circular symmetry for processing of circular wafers. The average radial dimensions or widths of the segmented pieces are significantly smaller than the radial dimension of a solid plate piece, which allows the use of individually controllable low-thermal-mass parts. Thus, the radial temperature distribution profile of a given radiation transfer ring will be established in a much faster time frame compared with a conventional large-area plate piece of the same thickness. The thickness of the radiation transfer ring, and therefor its thermal mass, can be made much smaller, making this invention suitable for all RTP (e.g., RTA, RTO, RTN, RTCVD, etc.) application.

BRIEF DESCRIPTION OF THE DRAWINGS

A more complete understanding of the present invention and advantages thereof may be acquired by referring to the following description taken in conjunction with the accompanying drawings in which like reference numbers indicate like features and wherein.

DETAILED DESCRIPTION OF THE INVENTION

Preferred embodiments of the present invention are illustrated in the FIGURES, like numerals being used to refer to like and corresponding parts of the various drawings.

The use of an energy transfer device improves controllability and repeatability for microelectronic device fabrication onto a substrate (such as fabrication of semiconductor silicon chips) by the use of any of a number of conventional thermal processing systems and methods. Conventional thermal processing systems and methods such as RTP systems have difficulty achieving high controllability and repeatability for device fabrication due to the inability to independently control the temperature profile within a substrate in real time. Conventional systems attempt to achieve uniform and repeatable temperature patterns for each substrate processed by measuring the energy level of the substrate on a single point throughout the thermal process. However, accurate temperature measurement and control are difficult to achieve for different zones or regions within the substrate. The energy transfer device of this invention improves upon conventional heating susceptors by allowing separation of zones and therefor providing enhanced multi-zone control capability and also by reducing the chance of substrate contamination through noncontact operation.

In addition, the use of an energy transfer device having a controlled and highly emissive surface allows accurate temperature measurement and control substantially independent of substrate emissivity effects. Pyrometry methods can measure substrate energy levels but pyrometry measurements depend upon consistent and fixed emissivity characteristics of the substrate through the heating process. When substrate emissivity characteristics vary, as frequently occurs during substrate heating (due to temperature effects, depositions of material layers, and/or variations of starting substrate materials), accurate temperature measurement and control cannot be accomplished without compensating for these variations. The use of an energy transfer device used as a buffer between the substrate and the radiant source improves upon direct wafer heating and temperature measurement by allowing emissivity independent substrate temperature measurement and control.

Figure 1:
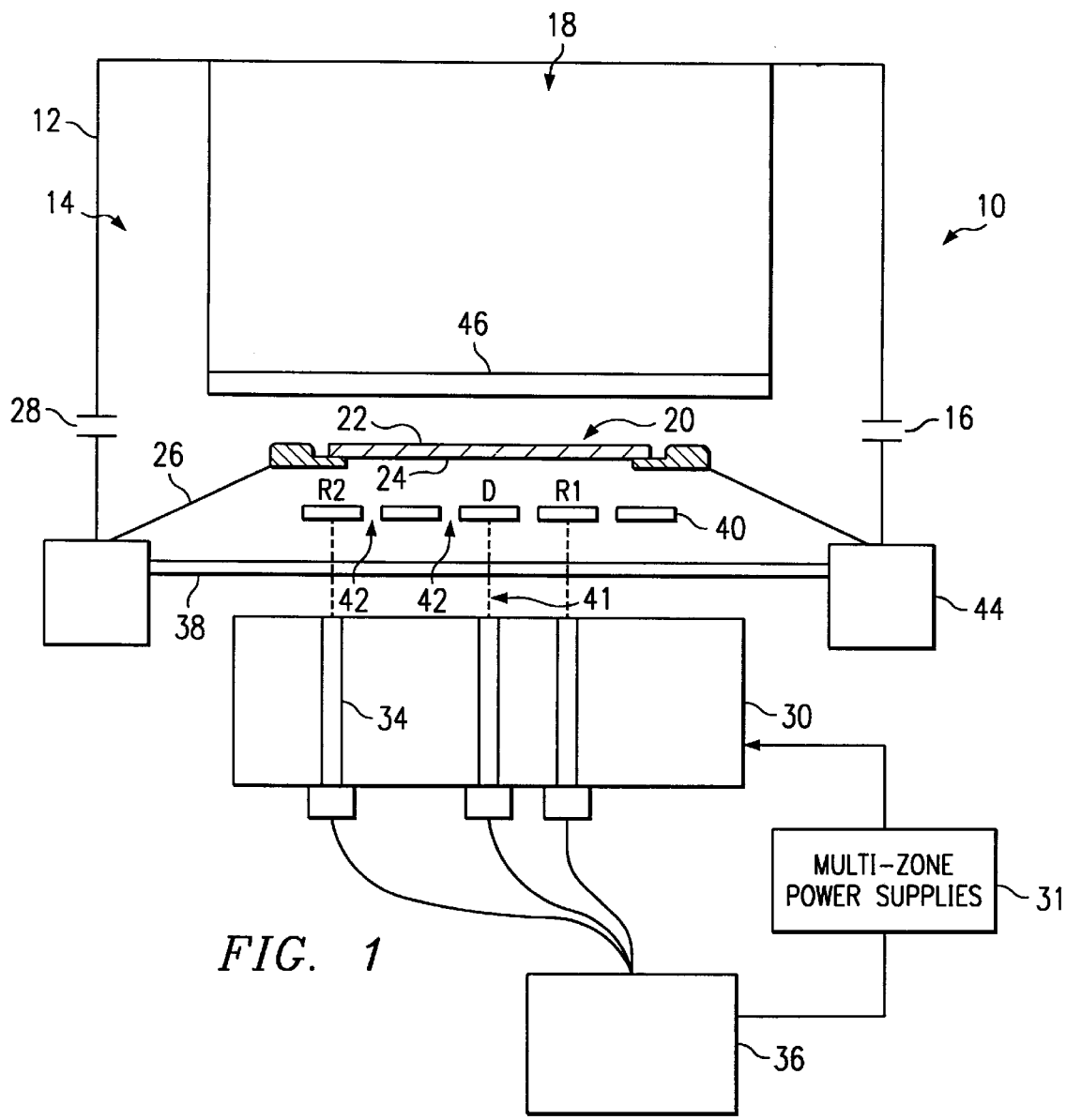
FIG. 1 depicts a side cutaway view of a single-wafer thermal processing system such as a multi-zone RTP system according to the present invention.

To increase the accuracy and repeatability of energy levels applied to substrates during thermal processing, the present invention applies energy to the substrate by using secondary radiation emitted from an energy transfer device. Referring now to FIG. 1, a side cutaway view of a thermal processing system such as an RTP system for device fabrication onto a substrate is depicted. The thermal processing system 10 depicted by FIG. 1 is a simplified depiction of a system adapted for accomplishing multi-zone rapid thermal processing (RTP). It should be understood that the present invention can be adapted to support other thermal processing apparatus and methods for the fabrication of microelectronic devices onto a substrate such as a semiconductor wafer.

A housing 12 defines a reactor process chamber 14 which can isolate a substrate in a controlled environment during thermal processing. A vacuum pump port 16 associated with housing 12 can be used to evacuate or otherwise control the pressure of process chamber 14 in conjunction with low-pressure RTP (e.g., RTCVD) processes. A gas injector showerhead 18 (preferably with a highly optically reflective surface) can provide reactive gases for supporting device fabrication in reactor chamber 14. A substrate 20 is disposed in reactor chamber 14 so that its frontside or active device side 22 is exposed to reactive gases provided to reactor chamber 14 by gas injection showerhead 18 (preferably with a highly optically reflective surface). Substrate backside 24 can be isolated from the reactive gases by a substrate support structure 26 in conjunction with a backside purge mechanism. Housing 12 and substrate support structure 26 can be comprised of conventional materials, such as stainless steel (for the process chamber) and quartz (for substrate support). A wafer transfer port 28 associated with housing 12 can allow loading and unloading of substrate 20 into and out of reactor chamber 14 by conventional techniques such as a central wafer handling system.

A multi-zone radiative energy source 30 provides radiant optical energy towards energy transfer device 40, energy transfer device 40 in turn re-radiating energy toward the backside 24 of substrate 20. Multi-zone radiative energy source 30 is preferably a multi-zone illuminator with plural lamp zones 32 for providing radiative optical energy, and plural embedded pyrometry sensors 34 for detecting radiation (and corresponding temperature values) at varying radial positions. The lamps are grouped or partitioned into multiple heat zones as described herein. A multi-zone controller 36 interfaces with power supplies 31 for radiative energy source 30 and pyrometry sensors 34 to adjust the optical flux values emitted by the lamps 32 in the zones according to the energy levels or corresponding temperatures detected by the pyrometry sensors 34. A quartz window 38 separates multi-zone radiative energy source 30 from substrate 20 without significantly decreasing the transfer of energy from lamps 32 to the backside of energy transfer device 40.

Energy transfer device 40 is disposed between multi-zone radiative energy source 30 and substrate 20. Energy transfer device 40 has a central disk region D, a first concentric ring region R1, and a second concentric ring region R2 (multiple additional rings may be used if necessary). Each region of energy transfer device 40 is associated with at least one or more zones of multi-zone radiative energy source 30, as is depicted by dotted lines 41, which show that each region is generally associated with a set of lamps 32 located in each zone of multi-zone radiative energy source 30 as well as a temperature sensor. Between each pair of regions is a free space gap 42 which separates the regions from each other. Free space gap 42 inhibits or suppress the direct transfer of thermal energy between adjacent regions. Thus, energy emitted from lamps 32 in zones associated with a region can be absorbed by the region without significant transfer or redistribution of energy occurring between the associated region and adjacent regions.

Figure 2A:
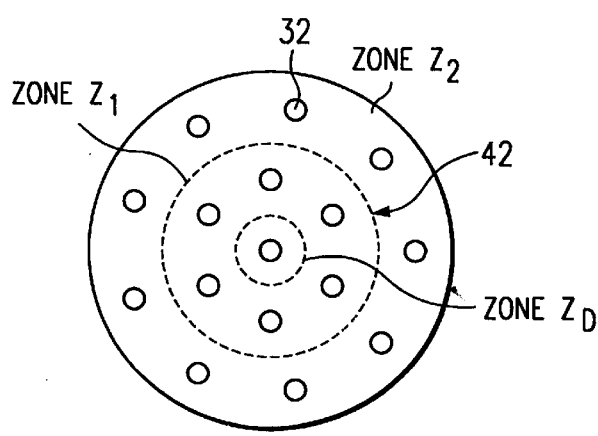
FIG. 2a depicts a top view of a multi-zone illuminator.
Figure 2:
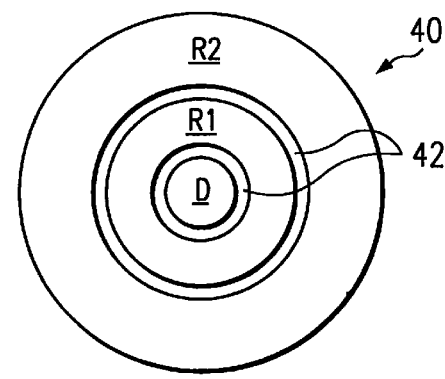
FIG. 2 depicts a top view of one preferred embodiment of an energy transfer device.

The relationship between energy transfer device 40 and multi-zone radiative energy source 30 can be better understood by reference to FIG. 2, which depicts a top view of energy transfer device 40, and FIG. 2a, which depicts a top view of multi-zone radiative energy source 30. Energy transfer device 40 shown in FIG. 2 has three energy transfer regions having high thermal conductivity and high emissivity properties: a centrally located circular shaped disk D, a first concentric ring R1 and a second concentric ring R2 (more number of rings may be used). The three emissive regions are separated from each other by two insulating regions, the insulating regions having reduced thermal conductivity and reduced emissivity properties. A first free space gap 42 exists between the inner circumference of concentric ring R1 and the outer circumference of central disk D. A second free space gap 42 exists between the outer circumference of concentric ring R1 and the inner circumference of the concentric ring R2. Central disk D and concentric rings R1 and R2 are comprised of a radiation-absorptive and thermally-conductive material which can absorb radiant optical energy and laterally diffuse radiative heat and emit secondary radiation to provide selective spatially resolved heating of different radial positions along backside 24 of substrate 20. Predetermined radial positions along substrate 20 can be selectively heated by adjusting the amounts of radiative energy absorbed and re-emitted from each emissive region of energy transfer device 40 that is associated with the predetermined radial position.

Referring to FIG. 2a, multi-zone radiative energy source 30 has plural lamps 32 disposed in plural heating zones so that, in one particular configuration, each heating zone can correspond to at least one emissive region (or plural emissive region) of energy transfer device 40. For instance, Zone $Z_D$ can associate with region D, zone $Z_1$ can associate with region R1, and zone $Z_2$ can associate with region R2. Each circularly symmetric heating zone can be aligned with energy transfer device 40 to direct substantially all of the radiative energy produced by each zone to selectively heat its associated high thermal conductivity and high emissivity region of energy transfer device 40. Thus, for example, if a central area of substrate 20 needed to be heated up preferentially over the rest of substrate 20 zone $Z_D$ can provide greater energy to region D, which in turn heats up the central region of substrate 20 more than other regions. One or more radiative heat zones, however, can correspond to one or more energy transfer rings. Although the concentric rings of the present embodiment of energy transfer device 40 are easily applicable to the circular heating zones of existing radiative energy sources such as multi-zone illuminators, in alternative embodiments, other non-oxisymmetrical shapes can be used to form the heating zones and energy transfer regions.

Multi-zone radiative energy source 30, energy transfer device 40, and substrate 20 are accurately aligned and separated from each other to maximize the accuracy, repeatability and control of heating applied to substrate 20. For instance, the separation between energy transfer device 40 and substrate 20 can be a distance significantly smaller than the width of each concentric ring to help ensure that there is a small amount of zone-to-zone radiation overlap on the substrate (e.g., for the radiant fluxes incident on the substrate from two adjacent emissive regions of heat transfer device 40). This ensures the ability for independent heating of the radial zones in the substrate with excellent spatial resolution. Free space gaps 42 are made large enough to ensure that direct conductive heat transfer between adjacent concentric rings is rather negligible, but small enough so that the majority of the radiation from the primary energy source 30 is absorbed by energy transfer device 40 and that majority of substrate heating occurs due to the radiant energy from heat transfer device 40. In embodiments in which the gaps are free spaces, small gaps ensure that direct radiation from multi-zone radiative energy source 30 to substrate 20 is only a small fraction of the total energy. The distance between multi-zone radiative energy source 30 and energy transfer device 40 is set so that substantially all radiative energy from a heat zone is directed towards its associated region of energy transfer device 40. In addition, the relationship between the width of each region of energy transfer device 40 and the distance between energy transfer device 40 and multi-zone radiative heat source 30 are set so that each pyrometry sensor 34 can separately measure the energy level and corresponding temperature of the region with which it is associated. Alternatively, imaging optics can be used for each pyrometry sensor to limit its view factor to within the width of its associated region of energy transfer device 40 so that the distance between the pyrometric sensor and the radiation transfer device 40 can be altered without affecting the pyrometric measurement and each pyrometry sensor 34 can provide an accurate energy level (and corresponding temperature) reading of its associated region to multi-zone controller 36. Controller 36 can then adjust the secondary radiation directed at substrate 20 by adjusting the primary radiation directed at energy transfer device 40.

In operation, multi-zone controller 36 adjusts the power to lamps 32 which irradiate energy transfer device 40. Energy transfer device 40 absorbs incident radiation from lamps 34 and provides secondary radiation to substrate 20. Pyrometry sensors 34 measure the energy level and corresponding temperature of each energy transfer region of energy transfer device 40 and provide the energy levels to controller 36. Controller 36 can then accurately estimate the heating that needs to be applied to substrate 20 and can adjust the power provided to each group of lamps 32 in zones to adjust the secondary radiation provided by each emissive region of energy transfer device 40 so that substrate 20 is heated according to a predetermined heating profile. To further improve the dispersal of heat to substrate 20, rotation mechanism 44 can rotate substrate 20 relative to primary multi-zone radiant energy source 30 and relative to energy transfer device 40 (if desired, energy transfer device 40 can also rotate with substrate 20). Rotation of substrate 20 can average out azimuthal non-uniformities created by geometrical and material deviations over each region within energy transfer device 40 as well as any intra-zone non-uniformities associated with primary radiant source 30. For instance, rotation of the substrate at a rate faster than the thermal time constant for lateral thermal diffusion over substrate 20 can minimize azimuthal nonuniform effects, particularly when the distance between substrate 20 and energy transfer device 40 (or the material properties of energy transfer device) can vary azimuthally.

In one alternative embodiment, a highly reflective surface (e.g., as an integral part of showerhead injector plate 46) can be aligned with the frontside 22 of substrate 20 to reflect substantially all of the radiative energy emitted from substrate frontside 22 back towards substrate 20. The reflective surface can be incorporated with a gas injector as is depicted by reflective gas injector 46 of FIG. 1.

The objective of having a reflective surface opposed to the frontside of substrate 20 is to create an optical cavity system that drives the effective substrate frontside emissivity towards a value of one. The effective emissivity of the substrate frontside in this optical system is defined by the equation:

$$E_{effective} = \frac{E_{substrate}}{1 - R_{showerhead}(1 - E_{substrate})}$$

where $R_{showerhead}$ is equal to the reflectively of the reflective gas injector 46. When the showerhead has a reflectivity of one and the lateral dimensions of the wafer, the showerhead and the energy transfer device are larger than the separation between them, the effective emissivity of the substrate frontside within the optical system approaches a value of one.

Reflective gas injector 46 minimizes the effects of the emissivity of substrate 20 on the thermal response of substrate 20 to the secondary radiation emitted by energy transfer device 40. The combination of highly emissive regions of energy transfer device 40 and a highly reflective gas injector 46 provide an optical cavity system that optimizes repeatable substrate heating and precision temperature measurement independent of the variable emissivity characteristics of substrate 20.

In alternative embodiments, energy transfer device 40 can be constructed of any material or materials having highly emissive regions separated from each other by substantially non-conductive regions. As used herein, emissive means a region that absorbs and re-emits substantially all radiative energy directed at it, and non-conductive means a region that allows limited or negligible transfer of thermal energy. The alternating rings of high and low emissivity regions and high and low thermal conductivity regions depicted in FIG. 2 could be arranged in alternative configurations as needed to associate high emissivity regions with at least one controllable heat zone so that energy irradiated from the heat zone can be translated by the high emissivity region to a predetermined region of a substrate. Further, the energy level of each high emissivity and high thermal conductivity region can be measured by alternative temperature sensors, including sensors actually physically coupled to each emissive region. The energy level of each high emissivity region can then be adjusted by altering the amount of radiative energy provided by the primary heating zone or zones associated with the high emissivity region, thus allowing a predictable and controlled amount of secondary radiation to heat the substrate.

Figure 3:
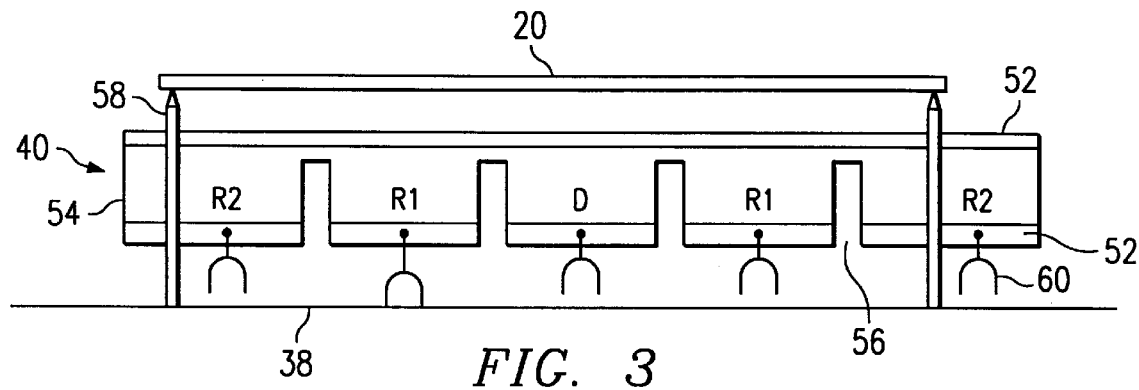
FIG. 3 depicts a side cutaway view of another embodiment of an energy transfer device constructed from a solid plate.

Referring now to FIG. 3, one embodiment of energy transfer device 40 is depicted. A coating of high emissivity material, such as silicon carbide latex 52, fares the substrate 20 on one side of energy transfer device 40 and fares towards quartz window 38 on the opposite side of energy transfer device 40. Silicon carbide latex 52 is deposited on a plate 54 formed of an efficient energy transferring material such as aluminum nitride or boron nitride ceramic materials or graphite. Trenches 56 are formed or machined into plate 54 to define and separate emissive regions D, R1, and R2. The silicon carbide latex 52 is a highly emissive material having an emissivity value approaching 1, whereas the aluminum nitride material exposed in each trench 56 has a reduced emissivity. Additionally, the trenches 56 significantly reduce the thermal conduction between adjacent high emissivity regions. Each high-emissivity region has a contact temperature sensor 60 (or a noncontact pyrometry sensor), such as a thermalcouple, in direct physical contact to allow precise temperature measurements of each region. A support pin 58 supports substrate 20 to prevent direct physical contact with energy transfer device 40, and to provide a spacing between the substrate 20 and energy transfer device 40.

The construction of energy transfer device 40 from a single plate of material can provide a robust system which can endure many thermal cycling stresses without substantially altering its physical properties. Alternatively, an energy transfer device 40 constructed from sets of separate pieces can advantageously reduce impact of thermal stress caused by expansion and contraction of the material. In either case, construction with material having similar thermal expansion coefficients can be used for enhanced reliability in thermal environments. For instance, silicon carbide and aluminum nitride are relatively thermally matched materials that expand and contract by comparable dimensions when subjected to thermal energy. Although FIG. 3 depicts substrate 20 as held proximate to but not touching energy transfer device 40, the solid plate configuration can also physically support substrate 20. However, embodiments in which energy transfer device 40 does not directly support substrate 20 can advantageously be constructed with minimal physical mass, allowing quicker, more accurate, and more repeatable heating responses.

Figure 4:
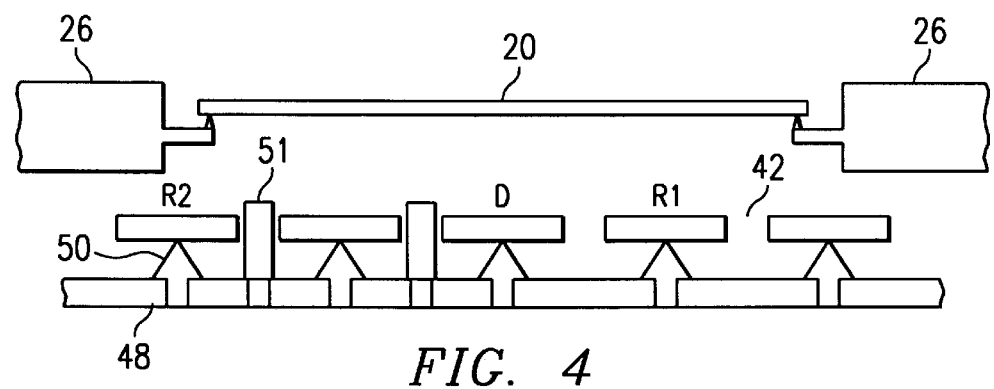
FIG. 4 depicts a spider leg support for an energy transfer device.

Referring now to FIG. 4, a spider leg support 48 is depicted which can provide physical support to energy transfer device 40, whether formed as separate concentric rings or as a single plate. Spider leg support 48 provides one implementation where supports for energy transfer regions are placed directly onto a transparent substructure such as the quartz window in an RTP system. Plural supports 50 in resting engagement with each region of energy transfer device 40 can hold each region in a predetermined position relative to substrate 20. Spider leg support 48 can be incorporated with quartz window 38, and can be used when substrate 20 is rotated with substrate support 26 relative to energy transfer device 40 (and relative to multi-zone illuminator 30).

Figure 5:
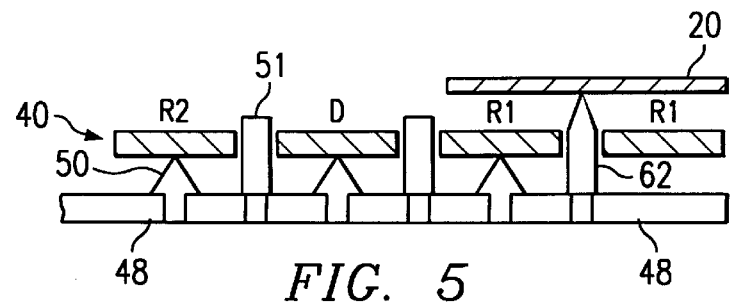
FIG. 5 depicts a substrate and energy transfer rings supported and adjusted by pins.

Referring now to FIG. 5, one embodiment of a support structure is depicted that enables adjustment of the distance between a substrate work piece 20, energy transfer device 40, and support structure 48. Plural supports 50 can be affixed to or removable from a transparent substructure, such as quartz window 38. The distance between window 38 and energy transfer device 40 can be adjusted by altering the length of supports 50. Similarly, the distance between energy transfer device 40 and substrate 20 can be adjusted by altering the length of substrate height adjustment pin 62. Alignment pins 51 maintain the position of energy transfer device 40 relative to window 38. Other pin arrangements or supporting structure can be substituted as needed for substrates of various sizes.

Figure 6:
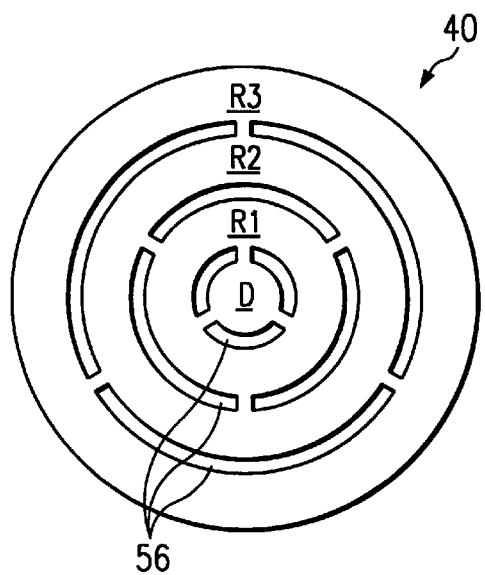
FIG. 6 depicts one embodiment of an energy transfer device formed with plural gaps cut into a single plate.

Referring now to FIG. 6, an alternative embodiment of energy transfer device 40 is depicted. Energy transfer device 40 is comprised of a single thin plate of material having physical properties that include a high emissivity approaching a value of one and a high thermal conductivity. For instance, the plate could be made of silicon carbide or materials coated with silicon carbide, such as aluminum nitride or graphite. The plate can have a minimal thickness, such as between one-half and two millimeters. Plural slot or gaps 56 can be machined in the plate as depicted to define high-emissivity, high-thermal conductivity regions D, R1, R2, and R3. Material left between the gaps can maintain the continuity of energy transfer device 40. Although FIG. 6 depicts circular gaps and regions, alternative embodiments could use alternate geometric designs.

Figure 7:
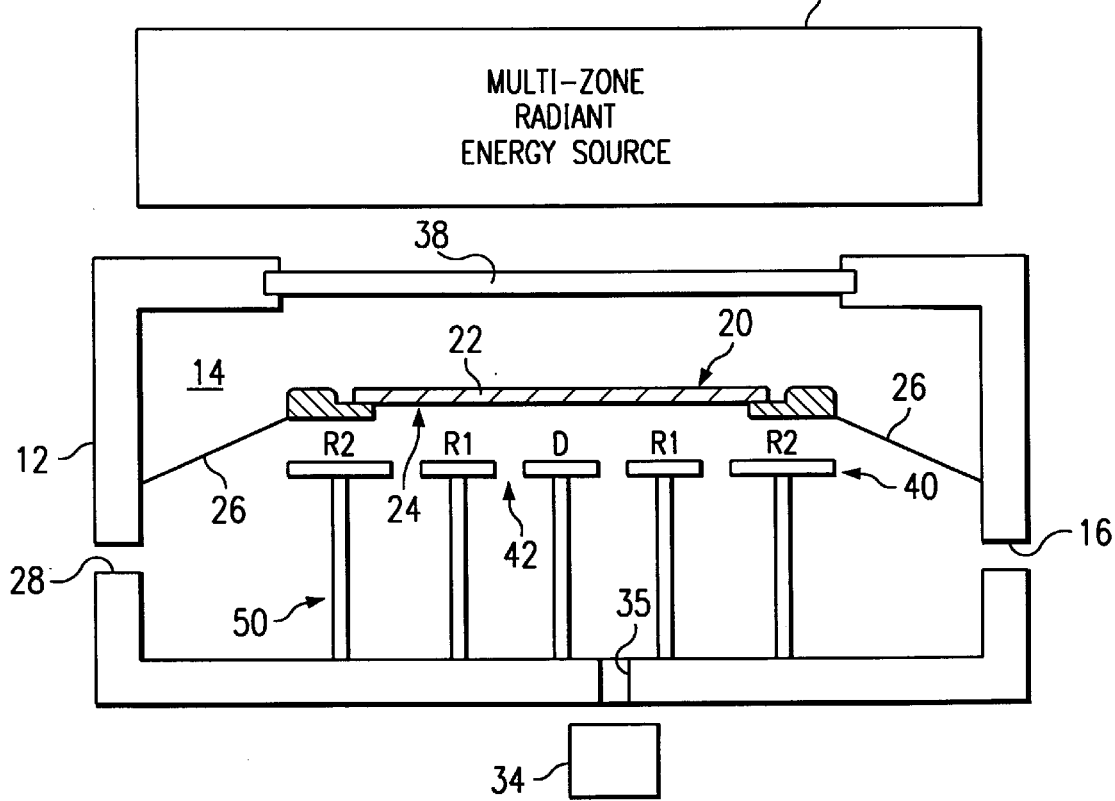
FIG. 7 depicts an alternative embodiment of the thermal processing system configured with the energy transfer device directed at the back side of the substrate.

Referring now the FIG. 7, an alternative configuration of thermal processing system 10 is depicted in which substrate 20 is disposed between radiant energy source 30 and energy transfer device 40. Radiant energy source 30 radiates energy directly to front side 22 of substrate 20, and energy transfer device 40 radiates secondary energy at back side 24 of substrate 20. In an alternative embodiment, thermal processing system 10 could be configured so that energy transfer device 30 could irradiate back side 24 of substrate 20 while energy transfer device 40 radiates secondary energy at frontside 22 of substrate 20. A pyrometry view port window 35 allows pyrometry sensor 34 to measure the energy from a region, such as region D, of energy transfer device 40 to allow adjustments of the energy irradiated from an associated zone of radiant energy source 30. Thermocouples could also be used to measure the energy level of the regions of energy transfer device 40 to support adjustments as described above. The configuration depicted by FIG. 7 advantageously allows indirect but accurate measurement of the energy level across the substrate by directly measuring the energy level at various regions of energy transfer device 40, with the energy level of the regions having a direct relationship to the energy level of associated areas of substrate 20.

In summary, the high performance energy transfer device and related multi-zone heating methodology described herein acts as an energy proxy by absorbing primary energy emitted by a heat source and then emitting secondary energy to heat a substrate. The plural energy transfer regions provide accurate energy transfer from associated heating zones of the heat source without masking the effects of control inputs to the heating zones, thus allowing independent control of different radial regions on the work piece. The secondary energy emitted towards the substrate can be accurately measured by sensors in physical contact with the emissive regions, or can be measured using noncontact pyrometry sensors according to the predictable emissivity characteristics of each emissive region.

Although the present invention has been described in detail, it should be understood that various changes, substitutions and alterations can be made hereto without departing from the spirit and scope of the invention as defined by the appended claims.

What is claimed is:

1. A thermal processing system for device fabrication onto a substrate, the system comprising:
   a housing forming a process chamber, the process chamber for protecting the substrate in a controlled environment during thermal processing;
   a radiant energy source directed at the substrate; and
   an energy transfer device disposed between the substrate and the radiant energy source, the energy transfer device comprising first and second regions, the first region having a first physical property, the second region having a second physical property different from the first physical property, and wherein the radiant energy source has plural zones, each zone associated with one or more of said first regions.

2. The thermal processing system of claim 1 wherein said physical properties comprise emissivities of said first and second regions.

3. The thermal processing system of claim 1 wherein said physical properties comprise thermal conductivities of said first and second regions.

4. The thermal processing system of claim 1 wherein said energy transfer device comprises a single-piece plate with plural openings.

5. The thermal processing system of claim 1 wherein said energy transfer device comprises at least one perforated plate piece.

6. The thermal processing system according to claim 1 wherein the energy transfer device further comprises a first set of plural regions, the first set of plural regions having a first physical property, and a second set of plural regions, adjacent regions of the first set separated by the second set of plural regions, the second set of plural regions having the second physical property.

7. The thermal processing system of claim 6 wherein said first and second physical properties comprise emissivities of said first and second regions.

8. The thermal processing system of claim 6 wherein said first and second physical properties comprise thermal conductivities of said first and second regions.

9. The thermal processing system according to claim 6 wherein the first set of plural regions comprises:
   a central disc region; and
   at least one ring disposed around the central disc region.

10. The thermal processing system according to claim 6 wherein said first set of plural regions comprises at least two rings.

11. The thermal processing system according to claim 9 wherein each ring has an inner circumference, and wherein the second set of plural regions comprises a free space gap associated with and adjacent to the inner circumference of each ring.

12. The thermal processing system according to claim 9 wherein each ring has an inner circumference, and wherein the second set of plural regions comprises a low-emissivity and low-thermal-conductivity material associated with the inner circumference of each ring.

13. The thermal processing system according to claim 6 wherein the energy transfer device further comprises a plate having alternating rings of high and low thermal conductivity.

14. The thermal processing system according to claim 6 wherein the energy transfer device is disposed in the reactor chamber proximate to the substrate, but not in contact with the substrate.

15. The thermal processing system of claim 14 wherein the gap between said energy transfer device and said substrate is in the range between a fraction of a millimeter and 10 millimeters.

16. The system according to claim 1 wherein the radiant energy source comprises plural optical heating lamps disposed in plural zones, the system further comprising:
   at least one sensor associated with the first region, the sensor for determining the radiative thermal energy level of the first region; and
   a controller interfaced with the sensor and further interfaced with at least one of the power supplies for the plural zones, the controller for altering the radiant energy emitted from lamps in the zone in order to adjust the energy level of the first region.

17. The system of claim 16 wherein said controller is a multi-zone controller.

18. The system of claim 16 wherein said thermal processing system is a rapid thermal processing system.

19. The system according to claim 16 wherein the sensor comprises a thermocouple temperature sensor coupled to the first region.

20. The system according to claim 16 wherein the sensor comprises a pyrometry temperature sensor.

21. A thermal processing system for device fabrication onto a substrate, the system comprising:
   a reactor chamber for protecting the substrate within a controlled environment during fabrication of the device;
   a multi-zone energy source directed at the substrate, the energy source having plural radiant energy zones, each radiant energy zone for providing an independent amount of radiant energy;
   an energy transfer device disposed between the multi-zone energy source and the substrate, the energy transfer device having plural energy transfer regions, each energy transfer region associated with at least one energy source zone;
   plural sensors, at least one sensor associated with each energy transfer region, the sensor for determining the radiant energy level of the associated region; and
   a controller interfaced with the plural sensors and further interfaced with the multi-zone energy source, the controller for adjusting the amount of radiant energy provided by each energy source zone according to the energy level of the energy transfer region associated with each heat source zone.

22. The thermal processing system of claim 21 wherein said energy transfer device is used to facilitate precision measurement and control of said substrate temperatures for varying substrate emissivity conditions.

23. The thermal processing system of claim 21 wherein said energy transfer device is used to facilitate uniform heating of said substrate for varying substrate emissivity conditions.

24. The system according to claim 21 wherein the energy transfer device further comprises plural low-thermal-conductivity regions, low-thermal-conductivity region associated with each energy transfer region.

25. The system according to claim 22 wherein the energy transfer device is disposed proximate to the substrate but not contacting the substrate, the system further comprising a substrate support structure for supporting the substrate in the process chamber during device fabrication.

26. The system according to claim 25 further comprising a rotation mechanism associated with the substrate support structure for rotating the substrate relative to the energy transfer device.

27. The system according to claim 25 further comprising a rotation mechanism associated with the substrate support structure for rotating the substrate relative to said multi-zone energy source.

28. The system according to claim 25 further comprising a rotation mechanism associated with said substrate support structure and said energy transfer device, the rotation mechanism for rotating the substrate support structure and the energy transfer device relative to said multi-zone energy source.

29. The system according to claim 22 wherein the multi-zone energy source comprises at least one lamp associated with at least one of the energy zones, the lamp for providing radiative optical energy.

30. The system according to claim 24 wherein each low-thermal-conductivity region comprises a free space gap between two of the plural energy transfer regions.

31. The system according to claim 22 wherein the energy transfer device comprises a plate divided into plural high emissivity and high-thermal-conductivity rings separated by plural low emissivity and low-thermal-conductivity rings.

32. The system according to claim 31 wherein the plural high emissivity rings comprise a high emissivity coating, and wherein the plural low emissivity rings are defined by trenches between the high-emissivity rings.

33. The system according to claim 32 wherein the coating comprises silicon carbide.

34. The system of claim 32 wherein said plate comprises a high-thermal-conductivity material.

35. The system of claim 34 wherein said material comprises aluminum nitride.

36. The system of claim 34 wherein said material comprises silicon carbide.

37. The system of claim 34 wherein said material comprises boron nitride.

38. The system according to claim 32 wherein said high-emissivity coating is deposited onto a graphite plate material.

39. The system according to claim 32 wherein said high-emissivity coating is deposited onto a ceramic plate material.

40. The system according to claim 39 wherein the ceramic plate material comprises aluminum nitride.

41. A thermal processing system for device fabrication onto a substrate, the system comprising:
   a housing forming a process chamber, the process chamber for protecting the substrate in a controlled environment during the thermal processing;
   a radiant energy source directed at the substrate; and
   an energy transfer device disposed between the radiant energy source and the substrate, the energy transfer device comprising first and second regions the first region having a first energy transfer characteristic and the second region having a second energy transfer characteristic, and wherein the radiant energy source has plural zones, each zone associated with one or more of said first regions.

42. The thermal processing system of claim 41 wherein said energy transfer characteristics comprise emissivities of said first and second regions.

43. The thermal processing system of claim 41 wherein said energy transfer characteristics comprise thermal conductivities of said first and second regions.

44. The thermal processing system of claim 41 wherein said energy transfer device comprises a single-piece plate with plural openings.

45. The thermal processing system of claim 41 wherein said energy transfer device comprises at least one perforated plate piece.

46. The thermal processing system according to claim 41 wherein the energy transfer device further comprises a first set of plural regions, the first set of plural regions having a first energy transfer characteristic, and a second set of plural regions, adjacent regions of the first set separated by the second set of plural regions, the second set of plural regions having the second energy transfer characteristic.

47. The thermal processing system of claim 46 wherein said first and second energy transfer characteristics comprise emissivities of said first and second regions.

48. The thermal processing system of claim 46 wherein said first and second energy transfer characteristics comprise thermal conductivities of said first and second regions.

49. A thermal processing system for device fabrication onto a substrate, the system comprising:
- a housing forming a process chamber, the process chamber for protecting the substrate in a controlled environment during thermal processing;
- a radiant energy source for providing radiant energy within the housing; and
- an energy transfer device having plural regions, the plural regions operable to transfer more than one energy level to the substrate in response to the radiant energy.

50. The thermal processing system of claim 49 wherein the plural regions comprise at least one physical property.

51. The thermal processing system of claim 49 wherein the radiant energy source comprises multiple zones.

52. The thermal processing system of claim 51 wherein the multiple zones comprise at least one lamp operable to provide radiative optical energy.

53. The thermal processing system of claim 50 wherein the physical property comprises emissivity.

54. The thermal processing system of claim 50 wherein the physical property comprises thermal conductivity.

55. A thermal processing system for device fabrication onto a substrate, the system comprising:
- a housing forming a process chamber, the process chamber for protecting the substrate in a controlled environment during thermal processing;
- a multi-zone source for providing radiant energy within the housing, the multi-zone source having first and second energy zones; and
- a thermal transfer device having first and second regions, each region associated with the first and second energy zones and configured to transfer energy to the substrate in response to the radiant energy.

56. The thermal processing system of claim 55 wherein the multizone source comprises at least one lamp operable to provide radiative optical energy.

57. The thermal processing system of claim 55, further comprising an energy detection device associated with the thermal transfer device.

58. The thermal processing system of claim 55, wherein said energy detection device is configured to detect the transferred energy and adjust the radiant energy in response to the detected energy.

59. The thermal processing system of claim 55, wherein the first and second regions comprise first and second physical properties.

60. The thermal processing system of claim 59, wherein the physical properties comprise emissivity.

61. The thermal processing system of claim 59, wherein the physical properties comprise thermal conductivity.

* * * * *